United States Patent
Bachu et al.

(10) Patent No.: US 7,818,632 B2
(45) Date of Patent: Oct. 19, 2010

(54) CODE-WORD LIST ALGORITHM

(75) Inventors: Raja S. Bachu, Des Plaines, IL (US); Michael E. Buckley, Grayslake, IL (US); Kenneth A. Stewart, Grayslake, IL (US); Clint S. Wilkins, Chicago, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 1000 days.

(21) Appl. No.: 11/427,057

(22) Filed: Jun. 28, 2006

(65) Prior Publication Data

US 2007/0033495 A1 Feb. 8, 2007

Related U.S. Application Data

(60) Provisional application No. 60/695,457, filed on Jun. 30, 2005.

(51) Int. Cl.
*G08C 25/02* (2006.01)
(52) U.S. Cl. .......... 714/48; 714/E11.001; 714/E11.177; 708/441
(58) Field of Classification Search ................. 714/749, 714/48, E11.001, E11.177; 708/441
See application file for complete search history.

(56) References Cited

U.S. PATENT DOCUMENTS

| | | | | |
|---|---|---|---|---|
| 5,208,816 A | * | 5/1993 | Seshardi et al. | ............. 714/795 |
| 5,537,440 A | * | 7/1996 | Eyuboglu et al. | ........... 375/245 |
| 6,088,407 A | * | 7/2000 | Buternowsky et al. | ...... 375/347 |
| 6,105,158 A | * | 8/2000 | Chen et al. | .................. 714/755 |
| 6,437,719 B1 | * | 8/2002 | Noro et al. | ................... 341/143 |
| 7,197,689 B2 | * | 3/2007 | Hekstra et al. | ............... 714/792 |
| 2005/0108597 A1 | * | 5/2005 | Iwami et al. | ................... 714/48 |

FOREIGN PATENT DOCUMENTS

| | | |
|---|---|---|
| EP | 0609188 A2 | 8/1994 |
| EP | 0998057 A1 | 5/2000 |
| WO | WO 2004040771 A1 * | 5/2004 |

OTHER PUBLICATIONS

Nambirajan Seshadri, Carol-Erik W. Sundberg; "List Viterbi Decoding Algorithms with Applications"; Feb./Mar./Apr. 1994; pp. 313-323.
A. Hafeez, K. J. Molnar, G. E. Bottomley; "Co-channel Interference Cancellation for D-AMPS Handsets"; VTC 1999, vol. 2; pp. 1026-103.1.
P. Castoldi, R. Raheli, G. Marino; "Efficient Trellis Search Algorithms for Adaptive MLSE on Fast Rayleigh Fading Channels"; CTMC-Globecom, Nov. 1994, Paper CTM06.4.
Seshadri N et al.: "Generalized Viterbi Algorithms for Error Detections with Convolutional Codes", IEEE Global Telecommunications Conference & Exhibtion, Nov. 27, 1989, pp. 1534-1538.

* cited by examiner

*Primary Examiner*—Scott T Baderman
*Assistant Examiner*—Enam Ahmed

(57) ABSTRACT

A communications system for reducing bit errors in a received data sequence provides a method for generating candidate code-word sequences for evaluation by a CRC decoder. The system may determine a most-likely received sequence using the probable code-word list of candidate sequences. The number of candidate sequences may be reduced using computational complexity reduction methods. A communications device also provides a candidate sequence generator for use with a CRC decoder to determine a most-likely received sequence and to reduce bit errors in a received sequence.

20 Claims, 6 Drawing Sheets

CODE-WORD LIST ALGORITHM

FIELD OF THE INVENTION

The invention relates to relates to reducing bit errors in communications systems. Specifically, the invention relates to reducing bit errors by using probable code-words and code-word complexity reduction.

BACKGROUND OF THE INVENTION

Channel coding is used to ensure the reliable transfer of information. In the absence of channel coding, as occurs with the CS-4 and MCS-4 GPRS/EGPRS coding schemes, the radio link performance is poor except under the most benign conditions. However, performance can be significantly improved by utilizing the CRC error detecting code in conjunction with the soft valued output of the demodulator for partial error correction.

In systems without error-correction coding, in the absence of channel decoding, a single estimated bit sequence is passed to the error-detecting decoder. The received frame is declared error-free if the CRC check succeeds. Prior-art methods dealing with improving the performance of non-coded systems rely on improving the demodulator. Usually these methods are computationally-intensive and the gain is marginal.

In the absence of channel coding, as is the case in the CS-4 coding scheme of GPRS, a single most-likely bit sequence is obtained from the demodulator (frequently, a Maximum Likelihood Sequence Estimator [MLSE] equalizer or other advanced receiver). This bit sequence is checked for error-detection using a CRC decoder. The received frame is declared error-free if the CRC check succeeds (i.e. the syndrome is zero). Otherwise, the frame is said to be in error.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE DRAWINGS

The application presents a system for decoding a bit sequence by producing more than one possible estimated bit sequence (i.e., a list of sequences) in systems without error-correction coding. The error-detecting code is used to either select the correct sequence or reject all sequences. The list of possible sequences is generated in a manner that takes advantage of the structure of typical error-detecting coding schemes. The current application is applicable to un-coded systems as well as coded systems.

Figure 1:
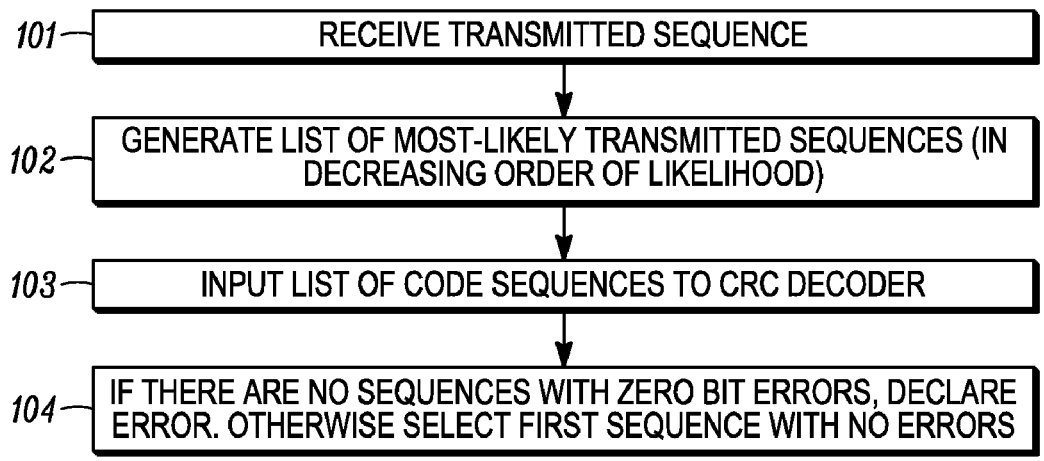
FIG. 1 presents a method for determining a received data sequence using code-words and complexity reduction.

FIG. 1 depicts a method for reducing errors in a data sequence 100. A data sequence is transmitted by a transmitter employing some form of data coding, which includes error-detecting coding. The data sequence may be encoded with an error-correction coding, but error-correction coding need not be present. In fact, the system is configured to process the data sequence without error-correction coding. The transmitted data sequence is received by the system 101. The data sequence may include one or more bits. As a consequence of transmission across a channel, the data sequence may have error bits in the data sequence. These error bits must be detected to decode the data sequence transmitted by the transmitter. The method next generates a list of most-likely transmitted data sequences 102. These most-likely transmitted data sequences are generated based on the bit sequence decoded from the transmitted data sequence. In addition, the most-likely transmitted data sequences are generated based on pre-selected parameters defining a likely number of error bits in the data sequence. The sequences are generated in order of decreasing likelihood or equivalently, increasing weight of an error vector with respect to the demodulated data sequence. The generated most-likely transmitted data sequences are then input to a decoder for processing 103. A typical decoder may be a cyclic redundancy check (CRC) decoder. The decoder determines if a sequence has bit errors 104. If there are no sequences without error bits in the decoded sequence, the method may declare an error 104. If the decoder processes a sequence with no errors, the method may select this first sequence with no errors as the most-likely transmitted sequence 104.

Figure 2:
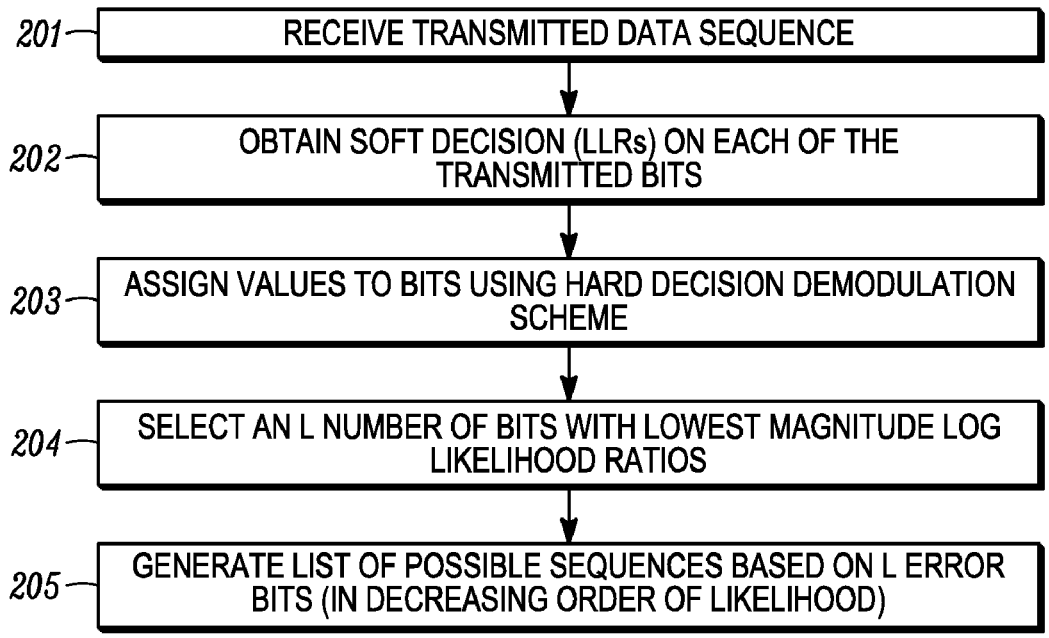
FIG. 2 presents a method for generating code-words for possible candidate sequences in the invention.

FIG. 2 presents the details of the demodulation process depicted in 100. A transmitted data sequence, which may include one or more data bits, is received by the system 201. The system may then demodulate the received data sequence 202 by assigning values to the received data bits. This may be accomplished by obtaining a soft decision on each of the data bits. An example of a soft decision process may include assigning a log-likelihood ratio (LLR) to each of the bits. A soft decision output process will assign a floating point value to each bit. The magnitude of the floating point number along with the sign of the number will determine the likelihood that the data bit can be assigned a binary value. The LLR of the bit expresses this likelihood using a logarithmic scale. The method may use the information contained in the LLR's of the bits, specifically generating an ordered list of bits ranked by their LLR from lowest to highest likelihood of correctness of the soft output decision.

The method next assigns a hard decision output value to the received data bits 203. The bits may be assigned a value of +1 or 0 based on the hard decision output process, using the sign of the received data bit as a determining factor. A number of bits, pre-determined by a number L, are selected 204 with the L lowest LLR values determined by the soft output decision process. These L bits are determined by the system as the most likely bits to be in error. In other words, they are the L bits most likely to be incorrect. The system could be adapted to correct every possible error in a data sequence. Instead, the system is configured to sacrifice 100% error detection for efficiency and reduced overhead of processing. The system next generates a list of possible sequences representing the most-likely received data sequence 205, based on the number L of possible error bits and the demodulated data sequence. The sequences are generated in order of decreasing likelihood, so that the most likely sequences are processed first by the decoder. This allows efficiency of processing and is more likely to select a sequence with no errors. The parameter L may be selected by a system designer and pre-programmed in the system, and may vary based on design parameters and system requirements.

Figure 3:
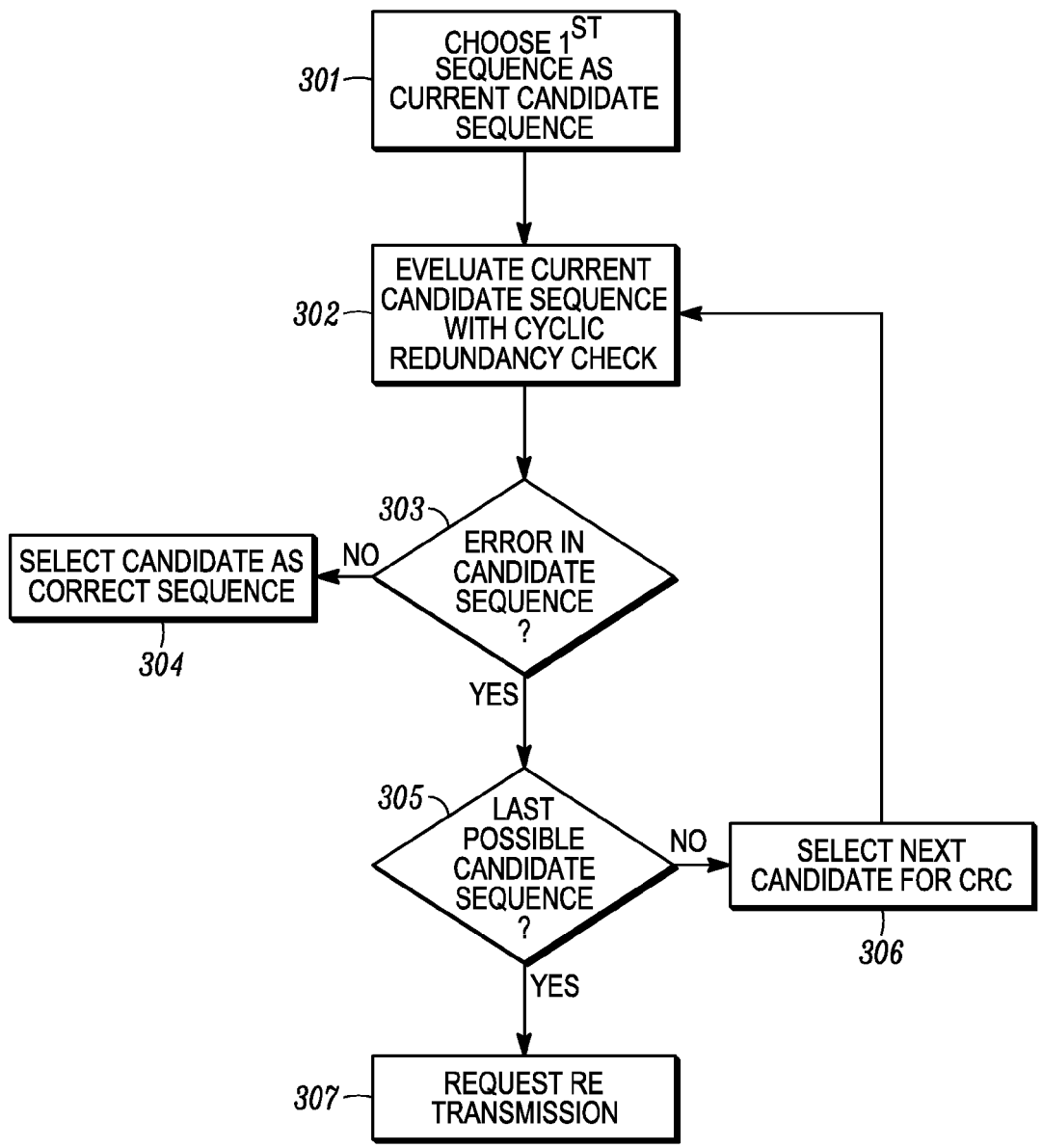
FIG. 3 presents a method for decoding a received sequence using a decoder and a list of candidate data sequences.

FIG. 3 depicts the processing of the generated candidate sequences by the decoder to determine a most-likely transmitted sequence 300. As described above, a list of data sequences is generated by the system for processing by a decoder. The decoder is generally a CRC decoder. The list of sequences are rank-ordered in order of decreasing likelihood, so that the most likely sequence is processed first 301. This first sequence is evaluated by the CRC decoder 302. If there is no error 303 in the processed sequence, then the candidate sequence is selected as the most-likely transmitted sequence 304. If there are errors detected by the CRC decoder 303, then the system determines if the candidate sequence is the last available sequence in the list of generated candidate sequences 305.

If there are no more candidate sequences 305, then the system declares the sequence in error and may request a retransmission 307 of the data sequence from the transmitter. If the candidate sequence is not the last available candidate sequence from the list of generated candidate sequences, then the next candidate sequence from the rank-ordered list of candidate sequences is selected 306 and input to the CRC decoder 302 for evaluation. The method 300 continues until either a candidate sequence is selected as the most-likely transmitted sequence 304 or the CRC decoder cannot find a candidate sequence without errors 305. Alternatively, the system may not request a retransmission of the data sequence and instead drops the received data sequence and process the next data sequence received by the receiver in the system.

Figure 4:
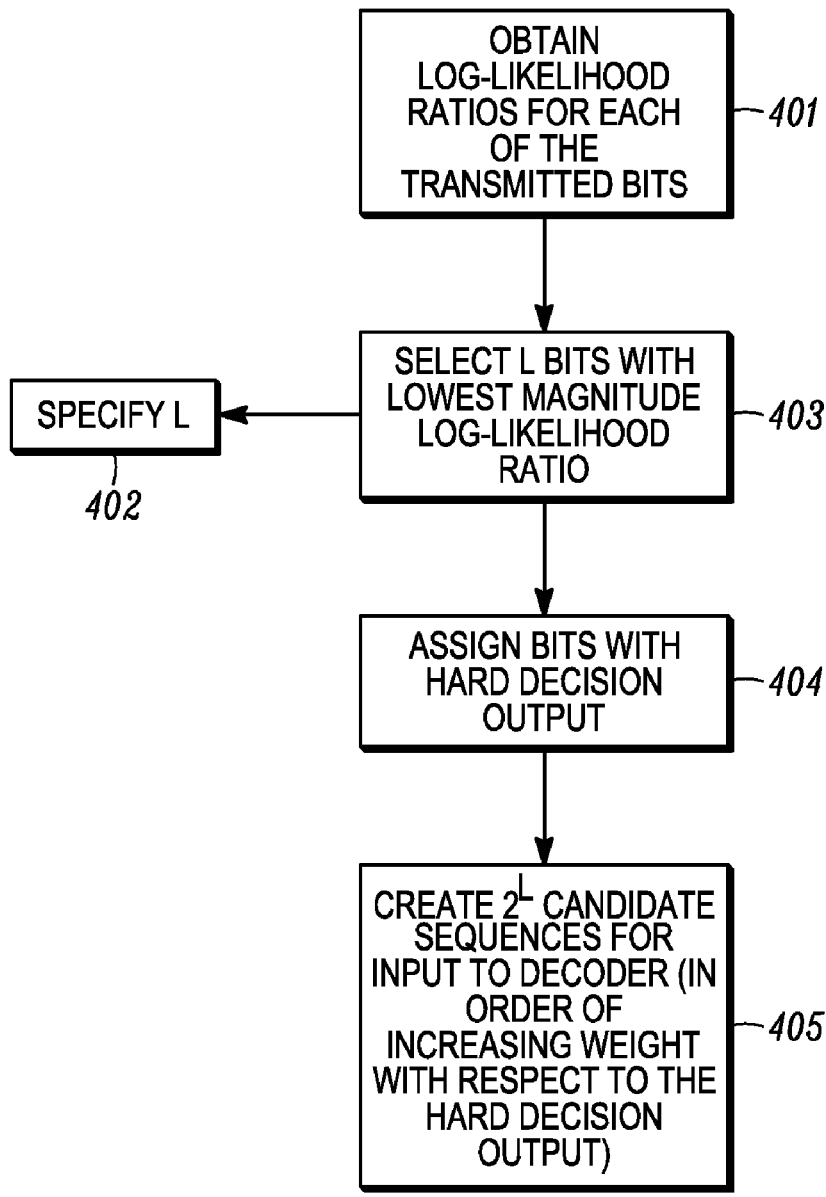
FIG. 4 presents a method for generating code-words using permutations of possible error bits in a candidate sequence.

The list of candidate sequences for processing by the CRC decoder may be determined in several ways, depending on the level of overhead available or desired in the system. FIG. 4 presents a simple method of generating the list of sequences, which also requires a large amount of overhead. The method 400 assigns a log-likelihood ratio (LLR) 401 to the data bits in the received data sequence using a soft decision process. A number of bits L, specified by the system 402, are selected based on the LLR of the demodulated data bits in the received data sequence. The data bits with the lowest LLR values are rank-ordered and selected accordingly 403. The bits are assigned a hard decision value 404 based on the signs of the demodulated data bits. A list of candidate sequences may be generated by taking all the possible permutations of the L most likely error bits 405. This results in $2^L$ sequences, since each of the L bits can take a value of +1 or 0. By increasing the value of L, more possible error bits are detected. However, the cost of that efficiency is an exponentially increasing list of candidate sequences to be processed by the decoder.

The system may incorporate complexity reduction to reduce the number of candidate sequences to be evaluated by the decoder. The system may select a subset of the $2^L$ possible generated sequences by taking advantage of attributes of the CRC encoding/decoding process and the CRC generator polynomial. For the CS-4 coding system of GPRS, a standard known in the art, the CRC generator polynomial is given by:

$$p_{gen}(D) = (1+D)(1+D+D^2+D^3+D^4+D^{12}+D^{13}+D^{14}+D^{15}) \quad (1.1)$$

Since 1+D is a constituent polynomial of (1.1), the number of possible bit errors could be narrowed based on whether $$P = \mathrm{mod}\left(\sum_{k=0}^{446} r(k), 2\right) = (0 \text{ or } 1), \quad (1.2)$$

where r represents the candidate sequence.

Figure 5:
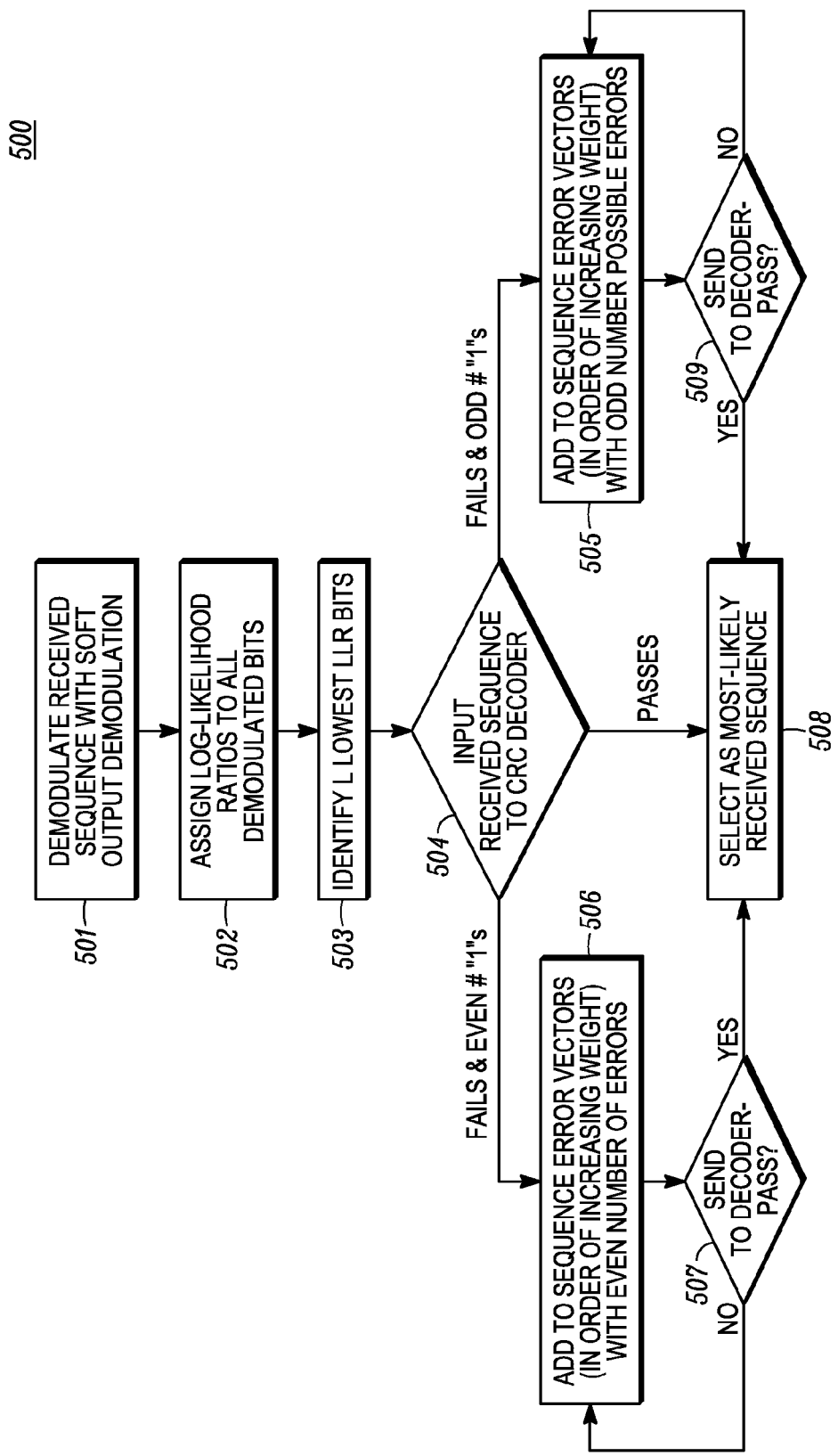
FIG. 5 presents a method for reducing the computational complexity of the decoding process.

The received data sequence, which may represent a code word of a sequence of information bits and an error vector generated by the transmitter's CRC error-detecting coding mechanism, may be evaluated by the CRC decoder in the system. By using a generating polynomial such as in (1.1), the nature of the polynomial is such that the number of "1" values in a sequence that fails the CRC decoder (has one or more errors) indicates the number of errors in the data sequence (by evaluating (1.2)). For example, if the number of "1" values in a failed sequence is an even number, this indicates that the number of errors in the sequence is an even number. If the number of "1" values is an odd number, the number of errors is an odd number. Through this property, the number of candidate sequences that need to be evaluated by the CRC decoder may be reduced further. FIG. 5 depicts a method 500 for reducing the complexity of the generated sequences in this manner.

A received data sequence is demodulated 501 by the system using a soft output demodulation process. In this process, as explained above, a log-likelihood ratio (LLR) is assigned 502 to each bit in the received data sequence. Then, the method identifies 503 the L bits with the lowest LLR's, where L is a parameter assigned and encoded in the system. A rank-ordered list of possible error bits is selected in the demodulated data sequence. The demodulated sequence is input to a CRC decoder 504 for error detection. The CRC decoder then processes the demodulated sequence, and if there are no errors detected 504, then the demodulated sequence is accepted as a most-likely received data sequence 508. If the CRC decoder fails the demodulated data sequence and at the same time indicates the number of errors in the sequence is even 504, the method will generate a list of candidate sequence error vectors to add to the demodulated data sequence 506. The sequences generated will have be rank-ordered in order of increasing error weight (i.e., decreasing likelihood of correctness) so that the sequences are processed by the CRC decoder in order of likelihood of correctness. In addition, the number of possible errors in the error vector will be an even number 506. For example, if L=5, the method will generate and select error vectors to add to the demodulated sequence with error weights {2} and {4}, but not {1}, {3}, or {5}. The number of sequences to evaluate is reduced by approximately 50% over the method 400 above, where the number of sequences is the number of permutations $2^L$. The data sequences with added error vectors are then input one at a time to the CRC decoder 507 for evaluation. If a sequence with even error vector passes (no errors), then that sequence is accepted as the most-likely transmitted data sequence 508. If the CRC decoder fails the sequence 507, then the next candidate sequence with error vector is input to the CRC decoder until all of the sequences are exhausted.

If the initial demodulated sequence fails the CRC decoder 504 and the number of errors in the demodulated sequence is an odd number, an identical procedure is followed. Instead, a list of sequence error vectors with odd numbers of possible errors is generated 505 and added to the candidate sequence 505. The sequences generated may be rank-ordered in order of increasing error weight (i.e., decreasing likelihood of correctness) so that the sequences are processed by the CRC decoder in order of likelihood of correctness. In addition, the number of possible errors in the error vector will be an odd number 505. For example, if L=5, the method may generate and select error vectors to add to the demodulated sequence with error weights {1}, {3}, and {5}, but not {2} or {4}. The number of sequences to evaluate is reduced by approximately 50% over the method 400 above where the number of sequences is the number of permutations $2^L$. The data sequences with added error vectors are then input one at a time to the CRC decoder 509 for evaluation. If a sequence with an odd error vector passes (no errors), then that sequence is accepted as the most-likely transmitted data sequence 508. If the CRC decoder fails the sequence 509, then the next candidate sequence with an odd error vector is input to the CRC decoder until all of the sequences are evaluated.

Figure 6:
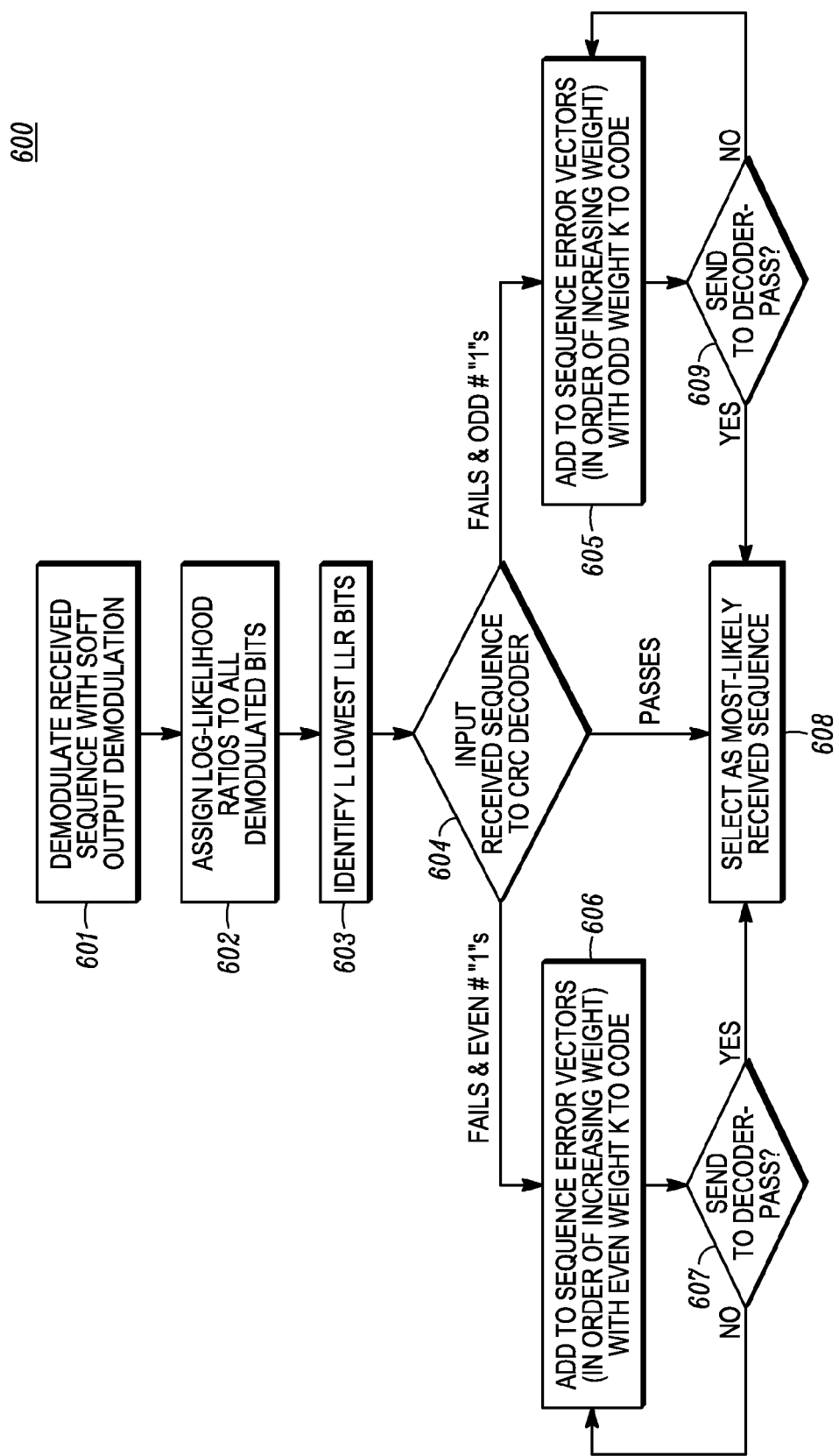
FIG. 6 presents another method for reducing the computational complexity of the decoding process.

The number of possible candidate sequences to evaluate may be even further reduced by bounding the possible number of error bits to be evaluated by the CRC decoder. This method 600 (shown in FIG. 6) parallels that presented in 500. A received data sequence is demodulated 601 by the system using a soft output demodulation process. In this process, as explained above, a log-likelihood ratio (LLR) is assigned 602 to each bit in the received data sequence. Then, the method identifies 603 the L bits with the lowest LLR's, where L is a parameter assigned and encoded in the system. By this step, a rank-ordered list of possible error bits is selected in the demodulated data sequence. The demodulated sequence is input to a CRC decoder 604 for error detection. The CRC decoder then processes the demodulated sequence, and if there are no errors detected 604, then the demodulated sequence is accepted as a most-likely received data sequence 608.

If the CRC decoder fails the demodulated data sequence and at the same time indicates the number of errors in the sequence is even 604, the method will generate a list of candidate sequence error vectors to add to the demodulated data sequence 606. The sequences generated may be rank-ordered in order of increasing error weight (i.e., decreasing likelihood of correctness) so that the sequences are processed by the CRC decoder in order of likelihood of correctness. In addition, the number of possible errors in the error vector will be an even number 606. In addition to the foregoing properties, the method will bound the number of possible errors by limiting the number of error vectors by an error weight bound K. K may be a number specified by the system, and will always be K≦L. The method generates and selects a number of error vectors to add to the demodulated data sequence such that the error vectors have error weight less than or equal to K. The error vectors are generated by sequentially creating, in the order of increasing error vector weight, all the individual combinations of the possible error bits within the error vector out of the number of candidate error bits L, where the possible error bits within the individual error vectors are assigned from a list of two values, and the number of possible error bits is less than or equal to L. For example, if L=5 and K=3 (the recommended values for DARP), and the number of error bits is an even number, the method will generate error vectors of error weight {2}, but not sequence of error weight {4}. This results in even more reduced complexity and reduction in number of sequences to be evaluated by the CRC decoder. The data sequences with added error vectors are then input one at a time to the CRC decoder 607 for evaluation. If a sequence with an even error vector passes (no errors), then that sequence is accepted as the most-likely transmitted data sequence 608. If the CRC decoder fails the sequence 607, then the next candidate sequence with error vector is input to the CRC decoder until all of the sequences are evaluated.

If the initial demodulated sequence fails the CRC decoder 604 and the number of errors in the demodulated sequence is an odd number, an identical procedure is followed. Instead, a list of sequence error vectors with odd numbers of possible errors generated 605 and added to the candidate sequence 605. The sequences generated may be rank-ordered in order of increasing error weight (i.e., decreasing likelihood of correctness) so that the sequences are processed by the CRC decoder in order of likelihood of correctness. In addition, the number of possible errors in the error vector will be an odd number 605. In addition to the foregoing properties, the method will bound the number of possible errors by limiting the number of error vectors by an error weight bound K. K may be a number specified by the system, and will always be K≦L. The method generates and selects a number of error vectors to add to the demodulated data sequence such that the error vectors have error weight less than or equal to K. The error vectors are generated by sequentially creating, in the order of increasing error vector weight, all the individual combinations of the possible error bits within the error vector out of the number of candidate error bits L, where the possible error bits within the individual error vectors are assigned from a list of two values, and the number of possible error bits is less than or equal to L. For example, if L=5 and K=3 (the recommended values for DARP), and the number of error bits is an even number, the method will generate error vectors of error weight {1} and {3}, but not sequence of error weight {5}. This results in even more reduced complexity and reduction in number of sequences to be evaluated by the CRC decoder. The data sequences with added error vectors are then input one at a time to the CRC decoder 609 for evaluation. If a sequence with an odd error vector passes (no errors), then that sequence is accepted as the most-likely transmitted data sequence 608. If the CRC decoder fails the sequence 609, then the next candidate sequence with an odd error vector is input to the CRC decoder until all of the sequences are evaluated. The performance improvement achieved by using this method 600 ranges from 2.1 dB to 4.8 dB over the method 500.

FIG. 9 compares the performance of this algorithm with that of the prior-art method for different values of L for the CS-4 coding scheme of GPRS with a DARP (Downlink Advanced Receiver Performance) receiver. The performance improves with increasing list-size and the gain could be as high as 5.5 dB. However, the complexity of the algorithm increases with L because of the exponentially increasing list-size.

Figure 7:
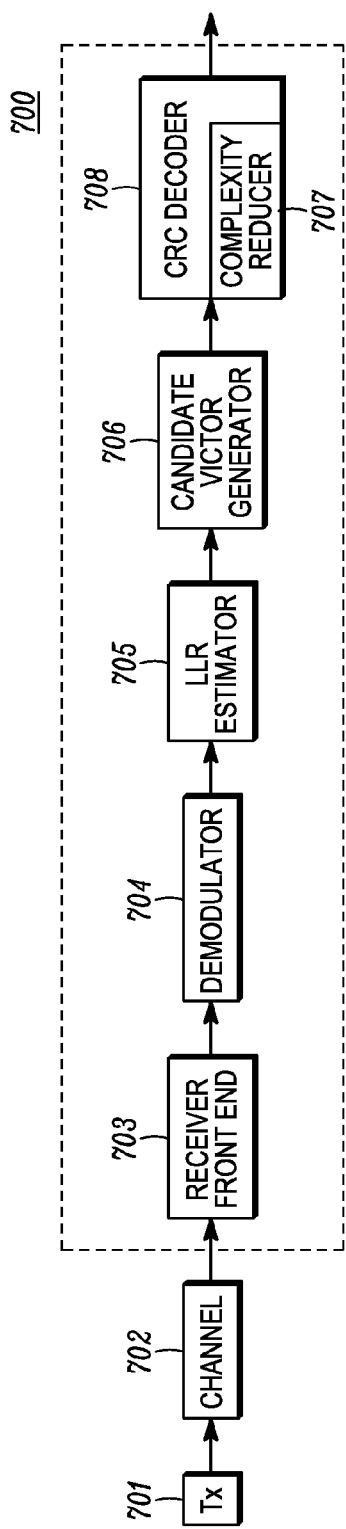
FIG. 7 presents a communications device for reducing bit errors using the method shown in FIG. 4.

The system also provides a communications device 700 for reducing bit errors in a data sequence, as shown in FIG. 7. The device 700 may be configured to implement the method indicated in 400 and may include a receiver 703 configured to receive a transmitted data sequence including one or more data bits, where the data sequence is encoded with an error-detecting code. The data sequence may be transmitted by a transmitter 701 and transmitted through a channel 702, which may result in the creation of error bits in the sequence received at the receiver 703. The device 700 may include a demodulator 704 configured to demodulate the data bits in the data sequence based on a decision process. The demodulator 704 may follow the receiver 703 in order to process the data sequence received at the receiver 703. The decision process may be a soft output decision process or a hard output decision process. However, a CRC decoder 708 will process hard output demodulated data sequences. The device may also include a likelihood estimator 705 for assigning values to a one or more candidate error bits. The likelihood estimator 705 may use a log-likelihood ratio estimator to assign values to the bits in the received data sequence. The likelihood estimator 705 may follow the demodulator 704 in order to process the demodulated data sequence after the demodulator 704.

The device 700 may include a data sequence generator 706 configured to generate a one or more candidate sequences, in order of increasing error vector weight, based on the number of candidate error bits. The sequences may be created by generating a list of candidate sequences, where the number of candidate sequences may be the number of permutations of possible error bits determined by the likelihood estimator 705, and where the number of possible error bits L may be specified by the system. The data sequence generator 706 may follow the likelihood estimator 705 to process the data sequence after processing by the likelihood estimator 705. The device 700 may also include a decoder 708 to process the candidate data sequences created by the data sequence generator 706. The device 700 may include a decoder 708 configured to detect errors in the candidate data sequences. The decoder 708 may follow the data sequence generator 706 so that the sequences generated by the data sequence generator 706 may be directly input to the decoder. The decoder 708 may further include a complexity reduction module 707 for reducing the number of sequences using a decision process such as described above in 500 or 600.

Figure 8:
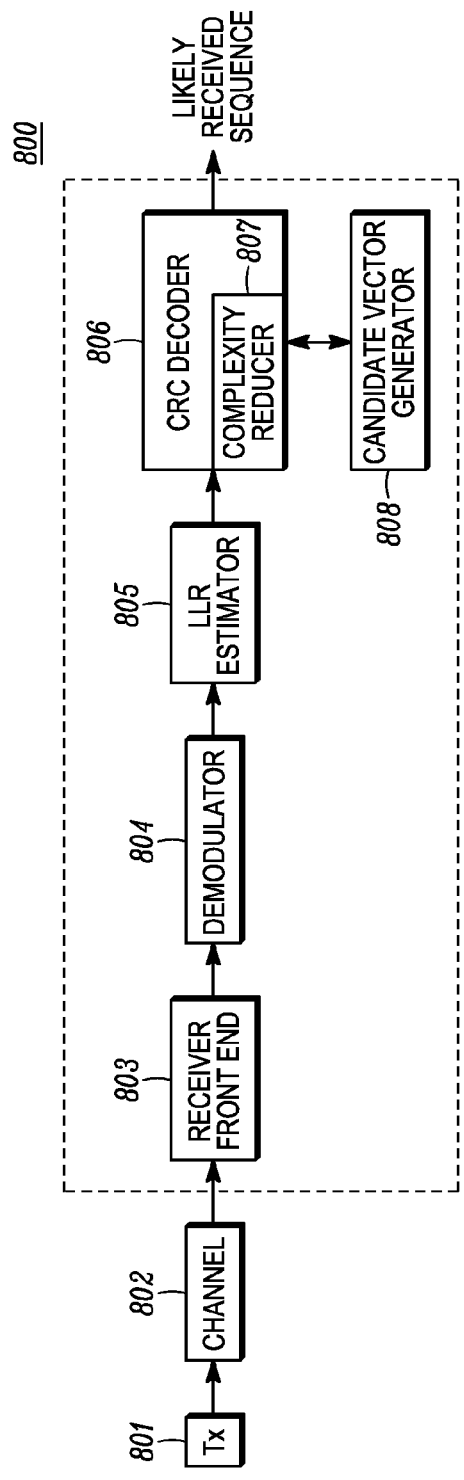
FIG. 8 presents a communications device for reducing bit errors using the methods shown in FIGS. 5 or 6.

The system also provides a communications device 800 for reducing bit errors in a data sequence, as shown in FIG. 8. The device 800 may be configured to implement the method indicated in 500 or 600 and may include a receiver 803 configured to receive a transmitted data sequence including one or more data bits, where the data sequence is encoded with an error-detecting code. The data sequence may be transmitted by a transmitter 801 and transmitted through a channel 802, which may result in the creation of error bits in the sequence received at the receiver 803. The device 800 may include a demodulator 804 configured to demodulate the data bits in the data sequence based on a decision process. The demodulator 804 may follow the receiver 803 in order to process the data sequence received at the receiver 803. The decision process may be a soft output decision process or a hard output decision process. However, a CRC decoder 808 will process hard output demodulated data sequences. The device may also include a likelihood estimator 805 for assigning values to a one or more candidate error bits. The likelihood estimator 805 may use a log-likelihood ratio estimator to assign values to the bits in the received data sequence. The likelihood estimator 805 may follow the demodulator 804 in order to process the demodulated data sequence after the demodulator 804.

The device 800 may include a decoder 806 configured to detect errors in the candidate data sequences. The decoder 806 may follow the likelihood estimator 805 so that the sequences generated by the likelihood estimator 805 may be directly input to the decoder 806. The decoder 806 may further include a complexity reduction module 807 for reducing the number of sequences using a decision process such as described above in 500 or 600.

The device 800 may include a data sequence generator 808 configured to generate a one or more candidate sequences, in order of increasing error vector weight, based on the number of candidate error bits. The sequences may be created by generating a list of candidate sequences, where the candidate sequences may be determined by the number of possible error bits L and an error weighting bound K, which may be specified by the system. The data sequence generator 808 may follow the decoder 806 and provide interactive communication with the decoder 806 so that candidate sequences may be iteratively input to the decoder 806.

The modules in the device (700 or 800) may be implemented with any standard microprocessor components, whether as discrete components or integrated circuit units. The receiver (703 or 803) may be implemented with any standard wireless receiver architecture, but may be implemented in receiver architecture meeting any revision by 3GPP GERAN of the GSM terminal receiver performance specification in accordance with the results of the current 3GPP GERAN DARP (Downlink Advanced Receiver Performance) Feasibility Study. Also, the receiver may be configured for other short-burst communication systems such as IS-54, or EDGE. The demodulator (704 or 804) and LLR estimator (705 or 805) may be implemented with any standard demodulator architecture, such as a Maximum Likelihood Sequence Estimator [MLSE] equalizer or other advanced receiver/demodulator equivalent. The candidate vector sequence generator may be implemented with any standard microprocessor architecture components, and the coding for the sequence generator may be implemented in memory in the sequence generator, firmware, or other memory that may be included with the device (700 or 800) as implemented. The decoder (708 or 808) may be a cyclic redundancy checking (CRC) decoder, implemented with any standard CRC decoder component or integrated circuit architecture implementing the device (700 or 800). The complexity reduction module (707 or 807) may likewise be implemented with any standard microprocessor architecture components, and the coding for the sequence generator may be implemented in memory in the sequence generator, firmware, or other memory that may be included with the device (700 or 800) as implemented. The device (700 or 800) may also provide architecture for accepting a demodulated data sequence as a most-likely transmitted data sequence, rejecting a data sequence as an error, or requesting a retransmission of the received data sequence from the transmitter (701 or 801). This architecture may be in the form of a standard microprocessor architecture, or implemented as coding in the memory or firmware associated with the device (700 or 800).

The system presented above may be used in either voice or data communications. Although the algorithm described was illustrated using a CS-4 coding scheme, it is, in general, applicable to any non-coded system. The proposal may be integrated into terminals meeting any revision by 3GPP GERAN of the GSM terminal receiver performance specification in accordance with the results of the current 3GPP GERAN DARP (Downlink Advanced Receiver Performance) Feasibility Study. Also, it may also be used in other short-burst communication systems such as IS-54, or EDGE. Importantly, it should be noted that the invention is applicable to a conventional GSM receiver operating on CS4 frames, and does not require DARP capability.

The sequence FIGS. 1-6 may be encoded in a signal bearing medium, a computer readable medium such as a memory, programmed within a device such as one or more integrated circuits, or processed by a controller or a computer. If the methods are performed by software, the software may reside in a memory resident to or interfaced to the device, a communication interface, or any other type of non-volatile or volatile memory interfaced or resident to the network logic. The memory may include an ordered listing of executable instructions for implementing logical functions. A logical function may be implemented through digital circuitry, through source code, through analog circuitry, or through an analog source such through an analog electrical, audio, or video signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable medium," "machine-readable medium," "propagated-signal" medium, and/or "signal-bearing medium" may comprise any means that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM" (electronic), a Read-Only Memory "ROM" (electronic), an Erasable Programmable Read-Only Memory (EPROM or Flash memory) (electronic), or an optical fiber (optical). A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A method for reducing errors in a data sequence comprising:
   receiving at a receiver from a transmitter a transmitted data sequence comprising bits, where the data sequence has been coded with an error-detecting code and has zero or more bit errors;
   demodulating the bits;
   generating likely-transmitted candidate sequences based on the demodulated bits of the received data sequence to send to a decoder, by creating candidate sequences, in order of increasing error vector weight;
   inputting the candidate sequences to a decoder in order of a decreasing likelihood or an increasing weight of error vector with respect to the demodulated bits;
   identifying a zero or more erroneous data sequences from the candidate sequences after processing the candidate sequences by the decoder; and
   rejecting the erroneous data sequences.

2. The method of claim 1, further comprising selecting a most-likely received data sequence if the decoder has identified a candidate sequence with zero bit errors.

3. The method of claim 2, further comprising sending a request to the transmitter to transmit the data sequence again if the decoder does not identify a candidate sequence with no errors.

4. The method of claim 1, where the data sequence does not contain error-correcting code.

5. The method of claim 3, where the generating candidate sequences comprises:
   assigning a likelihood indicator value to each bit;
   assigning a value to all of the demodulated bits using a decision process;
   selecting a one or more candidate error bits L from the demodulated bits, where the candidate error bits have rank-ordered lowest magnitude likelihood indicator values and the number of candidate error bits L is specified by the receiver; and
   generating a list of candidate sequences based on the number of candidate error bits in an order of an increasing error vector weight.

6. The method of claim 5, where the decision output process is a hard decision output process.

7. The method of claim 6, where the generating a list of candidate sequences comprises creating candidate sequences, in the order of increasing error vector weight, comprising all the permutations of the candidate error bits, where an individual error bit in the candidate sequence is assigned a value selected from a list of two values.

8. The method of claim 5, where the error-detecting code is a cyclic redundancy check (CRC) code and where the identifying a one or more erroneous data sequences further comprises:
   sequentially evaluating each candidate sequence with a CRC decoder; and selecting the candidate sequence as the most-likely received data sequence if the CRC decoder finds zero error bits in the candidate sequence.

9. The method of claim 6, where the error-detecting code is a CRC code with (1+D) as a factor of the CRC generator polynomial, and the generating comprises:
   processing the demodulated bits of the received data sequence with a CRC decoder;
   determining a number of "1" values of a one or more bits in the demodulated sequence if the CRC decoder determines the received data sequence has a one or more errors, and where the bits have a value of "1" or "0", and where a number of one or more possible error bits is an even number if the number of "1"-valued bits is even and where the number of one or more possible error bits is an odd number if the number of "1"-valued bits is an odd number;
   generating a list of one or more error vectors by sequentially creating, in the order of increasing error vector weight, all the individual combinations of the possible error bits within the error vector out of the number of candidate error bits L, where the possible error bits within the individual error vectors are assigned from a list of two values, and the number of possible error bits is less than or equal to L;
   sequentially adding an error vector from the list of error vectors to the demodulated sequence to create a one or more candidate sequences;
   selecting a candidate sequence with an even number of possible error bits if the number of "1"-valued bits is an even number; and
   selecting a candidate sequence with an odd number of possible error bits if the number of "1"-valued bits is an odd number.

10. The method of claim 9, where the CRC encoder follows the CS-4 coding scheme of the GPRS protocol.

11. The method of claim 9, further comprising:
    designating a weight variable K number of error bit positions, where K is less than the number of candidate error bits L; and
    selecting the candidate sequences, in the order of increasing error vector weight, with the number of possible error bits in the error vector less than or equal to K, where the K error bit positions are selected from among the L number of candidate error bits, whereby the number of candidate sequences to be evaluated by the decoder is reduced.

12. The method of claim 11, where the method is used in data communications systems.

13. The method of claim 11, where the method is used in voice communications systems.

14. A communications device for reducing bit errors comprising:
- a receiver for receiving a data sequence comprising data bits, where the data sequence is encoded with error-detecting coding;
- a demodulator for demodulating the data bits;
- a likelihood estimator for assigning lowest magnitude likelihood ratios to a number of candidate error bits less than or equal to the number of data bits;
- a data sequence generator for generating candidate sequences, in the order of increasing error vector weight, based on the number of candidate error bits;
- a decoder for decoding the candidate sequences; and
- a processor for rejecting one or more erroneous candidate sequences.

15. The communications device of claim 14, further comprising processor for accepting a most-likely received sequence.

16. The communications device of claim 14, further comprising processor for requesting retransmission of the data sequence if all candidate sequences are rejected.

17. A communications device for reducing bit errors in a data sequence comprising:
- a receiver configured to receive a transmitted data sequence comprising data bits, where the data sequence is encoded with an error-detecting code;
- a demodulator configured to demodulate the data bits in the data sequence based on a decision process;
- a likelihood estimator for assigning values to candidate error bits;
- a data sequence generator configured to generate candidate sequences, in order of increasing error vector weight, based on the number of candidate error bits; and
- a decoder configured to detect errors in the candidate data sequences.

18. The device of claim 17, where the demodulator is a hard output demodulator.

19. The device of claim 17, where the decoder is a cyclic redundancy check decoder.

20. The device of claim 17, where the likelihood estimator is a log-likelihood ratio estimator.

* * * * *